(12) United States Patent
Chiang et al.

(10) Patent No.: US 7,994,032 B2
(45) Date of Patent: Aug. 9, 2011

(54) METHOD OF MAKING DEEP JUNCTION FOR ELECTRICAL CROSSTALK REDUCTION OF AN IMAGE SENSOR

(75) Inventors: Shang-Yi Chiang, Los Also, CA (US);
Chung Wang, Fremont, CA (US);
Shou-Gwo Wuu, Hsin-Chu (TW);
Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/845,496

(22) Filed: Jul. 28, 2010

(65) Prior Publication Data

US 2010/0289102 A1    Nov. 18, 2010

Related U.S. Application Data

(62) Division of application No. 11/456,291, filed on Jul. 10, 2006, now Pat. No. 7,791,170.

(51) Int. Cl.
*H01L 21/38* (2006.01)
(52) U.S. Cl. . 438/558; 257/544; 257/549; 257/E21.544; 257/E25.005; 257/E27.124
(58) Field of Classification Search .................. 257/544, 257/549, E21.544, E25.005, E27.124; 438/558
See application file for complete search history.

(56) References Cited

U.S. PATENT DOCUMENTS

| | | | |
|---|---|---|---|
| 3,617,753 A | 11/1971 | Kato et al. | |
| 3,904,442 A * | 9/1975 | Anthony et al. | 438/415 |
| 3,979,230 A * | 9/1976 | Anthony et al. | 438/415 |
| 3,995,309 A | 11/1976 | Torreno | |
| 4,001,878 A | 1/1977 | Weimer | |
| 4,021,269 A * | 5/1977 | Anthony et al. | 438/541 |
| 4,154,632 A | 5/1979 | Mochizuki et al. | |
| 4,199,386 A | 4/1980 | Rosnowski et al. | |
| 4,290,830 A | 9/1981 | Mochizuki et al. | |
| 4,481,522 A | 11/1984 | Jastrzebski et al. | |
| 4,507,674 A | 3/1985 | Gaalema | |
| 4,648,909 A * | 3/1987 | Krishna et al. | 438/328 |
| 4,760,031 A | 7/1988 | Janesick | |
| 5,005,063 A | 4/1991 | Janesick | |
| 5,200,639 A * | 4/1993 | Ishizuka et al. | 257/508 |

(Continued)

FOREIGN PATENT DOCUMENTS

CN    1229526    9/1999

(Continued)

OTHER PUBLICATIONS

Japanese Patent Office, Office Action issued Feb. 15, 2010, Application No. 2006-175291, 4 pages.

(Continued)

*Primary Examiner* — Allan R Wilson
(74) *Attorney, Agent, or Firm* — Haynes and Boone, LLP

(57) ABSTRACT

The present disclosure provides an image sensor semiconductor device. The semiconductor device includes a substrate having a front surface and a back surface; a plurality of sensor elements formed on the front surface of the substrate, each of the plurality of sensor elements configured to receive light directed towards the back surface; and an aluminum doped feature formed in the substrate and disposed horizontally between two adjacent elements of the plurality of sensor elements and vertically between the back surface and the plurality of sensor elements.

20 Claims, 7 Drawing Sheets

U.S. PATENT DOCUMENTS

| | | |
|---|---|---|
| 5,244,817 A | 9/1993 | Hawkins et al. |
| 5,473,181 A | 12/1995 | Schwalke et al. |
| 5,508,625 A | 4/1996 | Adams |
| 5,511,428 A | 4/1996 | Goldberg et al. |
| 5,661,043 A | 8/1997 | Rissman et al. |
| 5,895,944 A | 4/1999 | Yamada |
| 5,900,623 A | 5/1999 | Tsang et al. |
| 6,012,336 A | 1/2000 | Eaton et al. |
| 6,168,965 B1 | 1/2001 | Malinovich et al. |
| 6,169,319 B1 | 1/2001 | Malinovich et al. |
| 6,227,055 B1 | 5/2001 | Pitzer |
| 6,259,085 B1 | 7/2001 | Holland |
| 6,269,199 B1 | 7/2001 | Maloney |
| 6,331,873 B1 | 12/2001 | Burke et al. |
| 6,429,036 B1 | 8/2002 | Nixon et al. |
| 6,504,196 B1 | 1/2003 | Rhodes |
| 6,518,085 B1 | 2/2003 | Wang et al. |
| 6,552,712 B1 | 4/2003 | Koizumi |
| 6,635,912 B2 | 10/2003 | Ohkubo |
| 6,670,258 B2 | 12/2003 | Carlson et al. |
| 6,765,276 B2 | 7/2004 | Fasen et al. |
| 6,821,809 B2 | 11/2004 | Abe et al. |
| 6,849,469 B1 | 2/2005 | Thuruthiyil et al. |
| 6,884,651 B2 | 4/2005 | Toyoda et al. |
| 6,946,352 B2 | 9/2005 | Yaung |
| 7,005,637 B2 | 2/2006 | Costello et al. |
| 7,042,060 B2 | 5/2006 | Costello et al. |
| 7,074,639 B2 | 7/2006 | Burke et al. |
| 7,148,464 B2 | 12/2006 | Shibayama |
| 7,232,697 B2 | 6/2007 | Hsu et al. |
| 7,535,073 B2 | 5/2009 | Ezaki |
| 2001/0012225 A1 | 8/2001 | Rhodes |
| 2001/0017344 A1 | 8/2001 | Aebi |
| 2002/0135034 A1 | 9/2002 | Shigenaka et al. |
| 2004/0149888 A1 | 8/2004 | Costello |
| 2004/0169625 A1 | 9/2004 | Park et al. |
| 2004/0178350 A1 | 9/2004 | Nagano et al. |
| 2004/0245642 A1 | 12/2004 | Hasunuma et al. |
| 2005/0090035 A1 | 4/2005 | Kim |
| 2005/0108672 A1 | 5/2005 | Teene |
| 2005/0110050 A1 | 5/2005 | Walschap et al. |
| 2005/0167709 A1 | 8/2005 | Augusto |
| 2005/0179053 A1 | 8/2005 | Ezaki et al. |
| 2005/0184322 A1 | 8/2005 | Inoue |
| 2005/0205954 A1 | 9/2005 | King et al. |
| 2005/0233493 A1 | 10/2005 | Augusto |
| 2005/0255625 A1 | 11/2005 | Janesick et al. |
| 2005/0287479 A1 | 12/2005 | Moon |
| 2006/0043519 A1 | 3/2006 | Ezaki |
| 2006/0057759 A1 | 3/2006 | Zhang et al. |
| 2006/0084195 A1 | 4/2006 | Lyu |
| 2006/0086956 A1 | 4/2006 | Furukawa et al. |
| 2006/0121640 A1 | 6/2006 | Kim |
| 2006/0138498 A1 | 6/2006 | Kim |
| 2006/0197171 A1 | 9/2006 | Zhang et al. |
| 2006/0249803 A1 | 11/2006 | Yamamoto et al. |
| 2006/0267123 A1 | 11/2006 | Wu et al. |
| 2006/0275945 A1 | 12/2006 | Yang et al. |
| 2006/0281215 A1 | 12/2006 | Maruyama et al. |
| 2007/0001100 A1 | 1/2007 | Hsu et al. |
| 2007/0023800 A1 | 2/2007 | Ohkawa |
| 2007/0052050 A1 | 3/2007 | Dierickx |
| 2007/0108476 A1 | 5/2007 | Hong |
| 2007/0117253 A1 | 5/2007 | Hsu et al. |
| 2007/0207586 A1 | 9/2007 | Kim |
| 2008/0108167 A1 | 5/2008 | Abe et al. |
| 2008/0173963 A1 | 7/2008 | Hsu et al. |
| 2008/0265348 A1 | 10/2008 | Maas et al. |

FOREIGN PATENT DOCUMENTS

| | | |
|---|---|---|
| CN | 1763965 | 4/2006 |
| CN | 1776917 | 5/2006 |
| CN | 1877845 | 12/2006 |
| CN | 1905201 | 1/2007 |
| GB | 2089565 A * | 6/1982 |
| JP | 64082666 | 3/1989 |
| JP | 07202161 | 8/1995 |
| JP | 11-008373 | 1/1999 |
| JP | 2002-076312 | 3/2002 |
| JP | 2003-152217 | 5/2003 |
| JP | 2003-158291 | 5/2003 |
| JP | 2004-233758 | 8/2004 |
| JP | 2004-241653 | 8/2004 |
| JP | 2004-319610 | 11/2004 |
| JP | 2005-150463 | 6/2005 |
| JP | 2005-206432 | 8/2005 |
| KR | 1020020005990 | 1/2002 |
| KR | 1020050103782 | 11/2005 |
| WO | WO9859373 | 12/1998 |

OTHER PUBLICATIONS

Japanese Patent Office, Office Action issued Jul. 17, 2009, Application No. 2006-175291, 4 pages.

Korean Intellectual Property Office, Notice of Preliminary Rejection issued May 28, 2008, Application No. 10-2007-0045138, 8 pages.

Williams, George M., et al., "Back-Illuminated CCD Images for High Information Content Digital Photography," SPIE, vol. 3302, Apr. 1998, pp. 39-53.

* cited by examiner

METHOD OF MAKING DEEP JUNCTION FOR ELECTRICAL CROSSTALK REDUCTION OF AN IMAGE SENSOR

CROSS-REFERENCE TO RELATED APPLICATION

This application is a Divisional application of co-pending U.S. patent application Ser. No. 11/456,291, filed Jul. 10, 2006, the disclosure of which is incorporated herein by reference in its entirety.

BACKGROUND

In semiconductor technologies, image sensors include a plurality of sensor elements, or pixels, formed in a semiconductor substrate. The sensor elements are used for sensing a volume of exposed light projected towards the semiconductor substrate. The sensor elements can be formed on the front side of the substrate and light can be projected towards the frontside or the backside of the substrate to reach the sensors. However, light targeted for one sensor element (and the electrical signal induced thereby) may spread to other sensor elements, which causes crosstalk. Improvements of the image sensor and/or the corresponding substrate are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
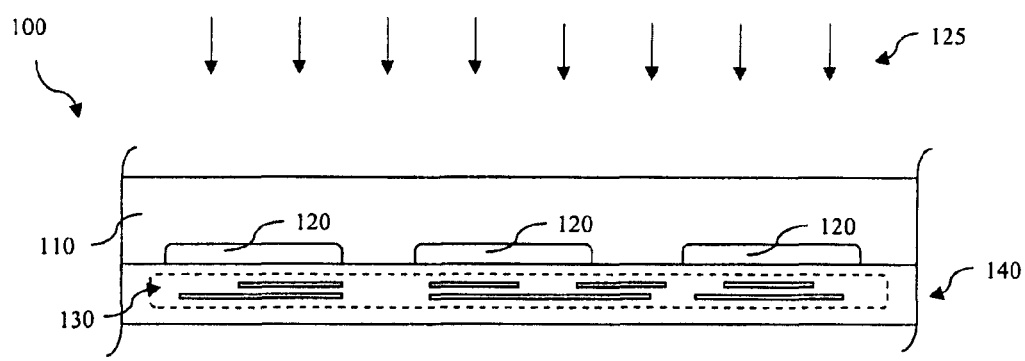
FIGS. 1-3 and 5-7 illustrate sectional views of one embodiment of a semiconductor device having a plurality of backside illuminated sensor elements at various fabrication stages constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

A backside illuminated image sensor with aluminum doped deep junction and a method making thereof will be described below with reference to FIGS. 1 to 7. First, provided is a semiconductor device 100 having a plurality of backside illuminated (or back-illuminated) sensor elements as illustrated in FIG. 1 in a sectional view of one embodiment.

The semiconductor device 100 includes a semiconductor substrate 110. The substrate 110 includes silicon in a crystalline structure. Furthermore, the silicon substrate 110 may have a <100> or <111> orientation which has a higher aluminum diffusion along the direction perpendicular to the plane of the substrate 110 relative to aluminum diffusions on the rest directions. The substrate 110 may alternatively or additionally include other elementary semiconductor such as germanium. The substrate 110 may also include a compound semiconductor such as silicon carbide, gallium arsenic, indium arsenide, and indium phosphide. In these cases, the substrate 110 is configured to have an orientation which has the highest aluminum diffusion relative to diffusions on the other directions of the substrate. The substrate 110 may include various p-type doped regions and/or n-type doped regions configured and coupled to form various devices and function features. All doping may be implemented using a process such as ion implantation or diffusion in various steps and techniques. The substrate 110 may include other features such as an epi layer, a semiconductor on insulator (SOI) structure, or combinations thereof.

The semiconductor device 100 includes sensor elements 120 (or pixels) formed in and/or on the front surface of the semiconductor substrate 110. In one embodiment, the sensor elements may be disposed on the front surface and extend into the semiconductor substrate 110. The sensor elements 120 each may include a light-sensing region (image sensing region or photo-sensing region) which may be a doped region having N-type and/or P-type dopants formed in the semiconductor substrate 110 by a method such as diffusion or ion implantation. The light-sensing region may have a doping concentration ranging between about $10^{14}$ and $10^{21}$ atoms/cm$^3$. The light-sensing region may have a surface area ranging between about 10% and 80% area of the associated sensor element, being operable to receive light (or radiation from an object to be imaged). Examples of sensor elements 120 include photodiodes, complimentary metal-oxide-semiconductor (CMOS) image sensors, charged coupling device (CCD) sensors, active sensor, passive sensor, and/or other devices diffused or otherwise formed in the substrate 110. As such, the sensor elements 120 may comprise conventional and/or future-developed image sensing devices.

The semiconductor device 100 may include a plurality of sensor elements disposed in an array or other proper configuration. The plurality of sensor elements may be designed to have various sensor types. For example, one group of sensor elements may be CMOS image sensors and another group of sensor elements may be passive sensors. Moreover, the sensor elements 120 may include color image sensors and/or monochromatic image sensors. The device 100 is designed to receive light (or radiation) 125 directed towards the backside surface of the semiconductor substrate 110 during operations, eliminating obstructing the optical paths by other objects such as gate features and metal features, and maximizing the exposure of the light-sensing region to the illuminated light. The substrate 110 may be relatively thin so that the light directed through the back surface thereof may effectively reach the sensor elements 120.

The semiconductor device 100 further includes a multilayer interconnect (MLI) 130 coupled to the sensor elements 120 such that the sensor elements 120 are operable to properly respond to illuminated light. The multilayer interconnect (MLI) 130 may be formed on the semiconductor substrate 110 and disposed on the front surface overlying the sensor elements 120. The multilayer interconnect 130 may include conductive materials such as aluminum, aluminum/silicon/ copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form metal silicide. Alternatively, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

The semiconductor device 100 further includes an interlayer dielectric (inter-level dielectric or ILD) 140 to isolate the multilayer interconnect 130 disposed therein. The ILD 140 can be a material of a low dielectric constant such as a dielectric constant less than about 3.5. The ILD 140 may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD 140 may be formed by a technique including spin-on, CVD, sputtering, or other suitable processes. The MLI 130 and ILD 140 may be formed in an integrated process such as a damascene process or lithography/plasma etching process.

Figure 2:
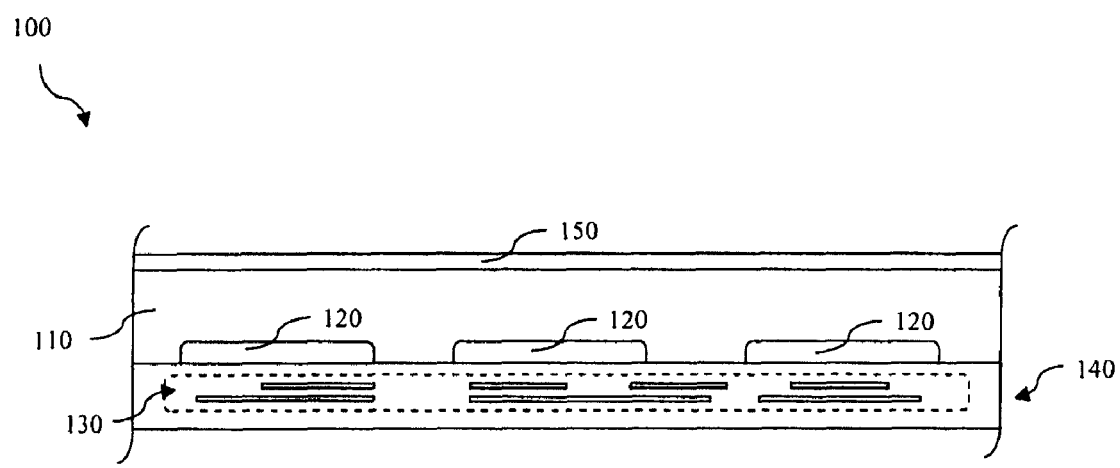

Referring to FIG. 2, a masking layer 150 is formed on the back surface of the substrate 110 to block aluminum diffusion (or aluminum migration). The masking layer 150 includes a material selected from silicon oxide, silicon nitride, silicon oxynitride, other proper dielectric material, and combinations thereof. Alternatively or additionally, the masking layer 150 may include a barrier material known in the art such as titanium, titanium nitride, tantalum, or tantalum nitride. The masking layer 150 may have a multilayer structure for optimized masking effect. For example, the masking layer 150 have a structure with stacked titanium, titanium nitride, and silicon oxide films. The masking layer 150 is thick enough to block aluminum diffusion. The masking layer 150 may be formed by a method including thermal processing such as thermal oxidation or thermal nitridation, spin-on coating, chemical vapor deposition (CVD), physical vapor deposition (PVD), or combinations thereof. In one example, titanium/ titanium nitride films may be formed by sputtering and a silicon oxide film may be formed overlying the stacked titanium/titanium nitride by a CVD technique.

Figure 3:
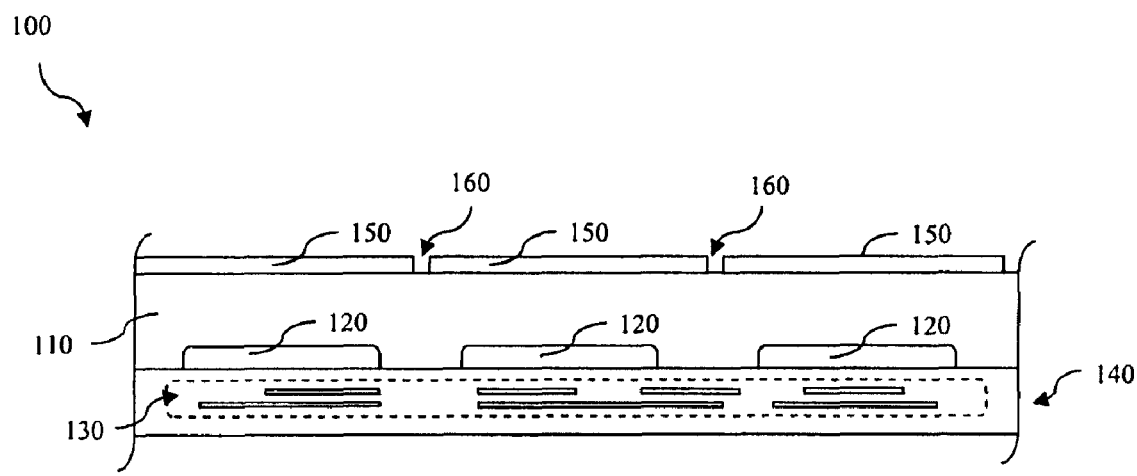
Figure 4:
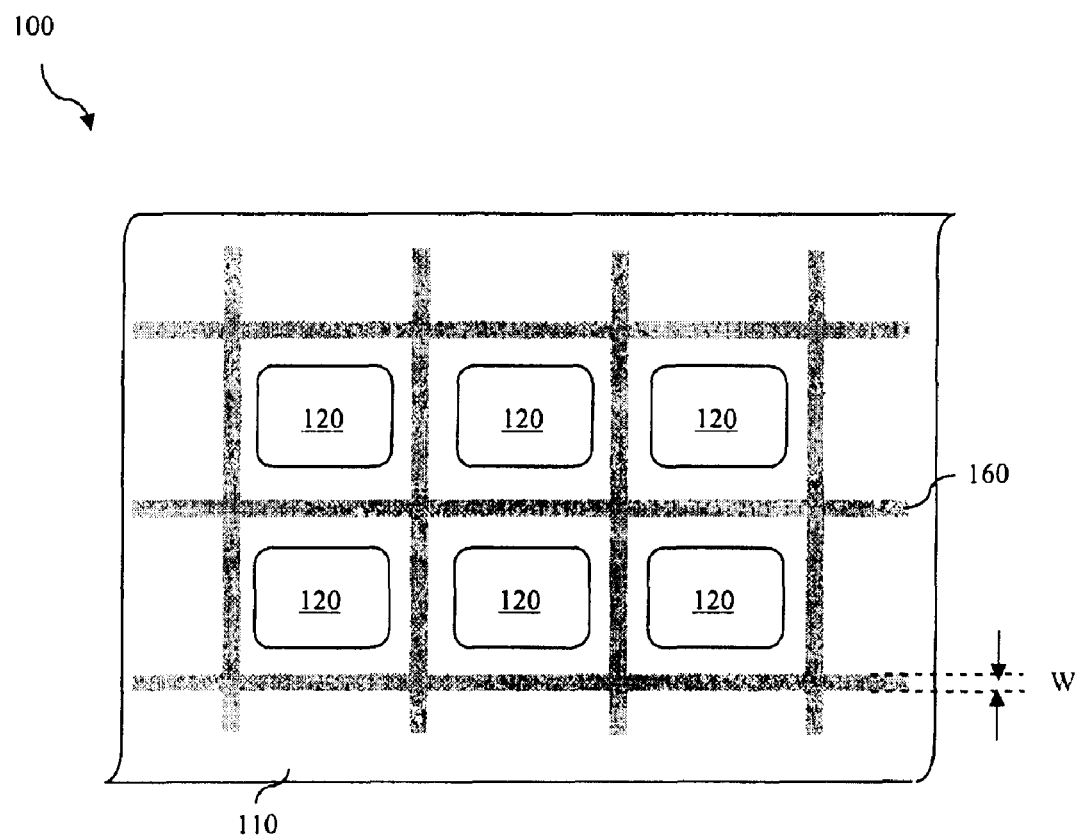
FIG. 4 illustrates a top view of one embodiment of a semiconductor device of FIG. 3 at one fabrication stage constructed according to aspects of the present disclosure.

Referring to FIGS. 3 and 4, the masking layer 150 is patterned to form a plurality of openings 160 to expose the semiconductor substrate 110 within the openings. The openings 160 are designed and positioned to regions where an aluminum doped deep wall is to be formed in the underlying substrate 110. The openings 160 are positioned between adjacent sensor elements in the top view as illustrated in FIG. 4. The openings 160 are designed to substantially enclose a sensor element. The openings 160 may be designed in various dimension and shape. For example, the openings around a sensor element may be a square or a circle. The openings 160 may have a width, labeled as "W" in FIG. 4, ranging between about 0.1 micron and 5 micron. The openings 160 can be formed by various patterning methods known in the art, including a photolithography process and an etching technique such as dry etching (plasma etching) or wet etching. In one example, a photoresist layer is formed on the masking layer 150 and patterned by a photolithography process to form corresponding openings in the photoresist layer. Then a plasma etch is employed to etch the exposed masking layer within the photoresist openings. The photoresist layer is removed thereafter either by wet stripping or plasma ashing.

Figure 5:
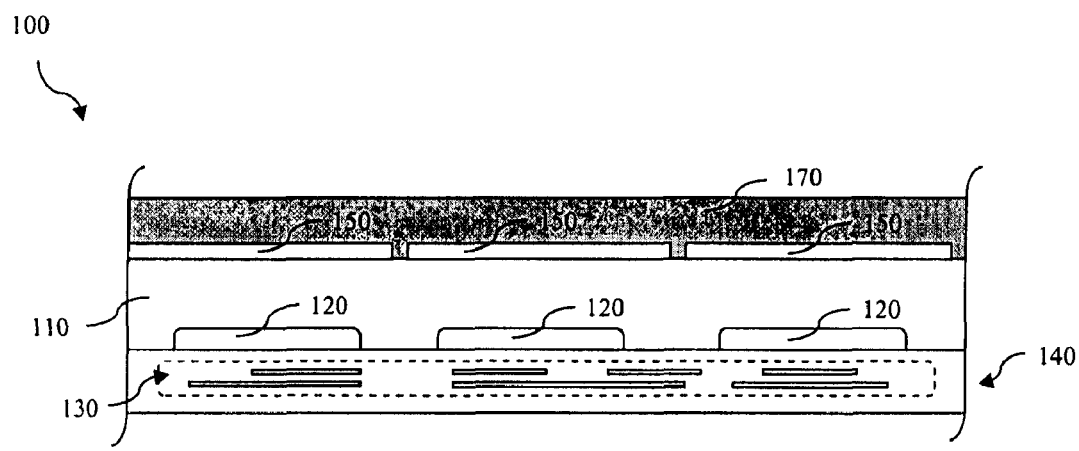

Referring to FIG. 5, an aluminum-containing layer 170 is formed on the semiconductor substrate 110 within the openings 160 of the masking layer 150 and may also be formed on the patterned masking layer 150. The aluminum-containing layer may additionally include other material such as a small percentage of silicon as Al/Si alloy for improved performance. The aluminum-containing layer may have a thickness about 1000 Angstroms or more. The aluminum-containing layer 170 may be formed by PVD, CVD, plating, or a combination thereof. For example, the aluminum-containing layer 170 may be formed by sputtering. Optionally, the aluminum on the patterned masking layer may be removed by a process such as chemical mechanical polishing (CMP) such that aluminum is only left on the semiconductor substrate within the openings 160 of the masking layer 150.

Figure 6:
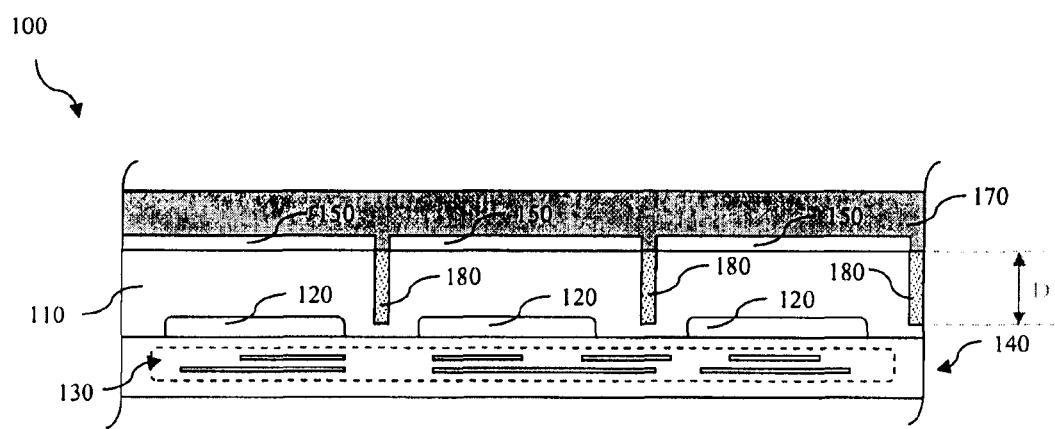

Referring to FIG. 6, a thermal process is employed to drive aluminum into the semiconductor substrate 110 within the openings 160 of the masking layer 150 to form an aluminum doped deep wall 180 in the semiconductor substrate 110 and interposed between adjacent sensor elements. The aluminum doped deep wall 180 may extend substantially between the back surface of the semiconductor substrate 110 and the sensor elements 120. In one embodiment, the aluminum doped deep wall may be extended close to the ILD 140. The deep wall 180 may have an aluminum concentration ranging between about $10^{13}$ atoms/cm$^3$ and $10^{20}$ atoms/cm$^3$. The thermal process of driving aluminum may be a thermal annealing process performed by a tool such as a rapid thermal process (RTP) tool or a flashing annealing tool. The annealing temperature may range between about 400° C. and 600° C. If MLI 130 is compatible with higher temperature, the annealing temperature may range between about 400° C. and 1200° C. In another embodiment, a laser annealing is employed for the thermal process. A laser beam may be focused to the aluminum-containing layer and the underlying semiconductor substrate within the openings 160 of the masking layer 150. Thus high temperature may be achieved in local areas without overheating the rest of the semiconductor device 100, including the MLI 130. The thermal annealing may last from a few minutes to tens of hours depending on the expected height of the aluminum doped deep wall 180. As mentioned above, in the present embodiment, the silicon substrate 110 has a <100> or <111> orientation such that aluminum diffusion (or migration) along the direction perpendicular to the substrate is much higher than aluminum diffusion to other lateral directions. Therefore, the aluminum doped deep wall 180 can be formed without much lateral distortion. Height of the aluminum doped deep wall 180 is determined by thickness of the substrate 110. Preferably the height of the aluminum doped deep wall 180 is greater than one-fourth of the thickness of the substrate 110 to reduce crosstalk. For example, thickness of the substrate 110 is about 4 micron, height of the aluminum doped deep wall 180 will be greater than about 1 micron. The aluminum doped deep wall 180 may have a ratio of depth/width (or height/width) greater than about 3.

The doped deep wall 180 in combination with a doped semiconductor substrate contacting the deep wall forms a deep junction and function as an isolation feature, so that electrical signals induced by imaging radiation toward one sensor element during operation may be isolated from spreading to other sensor elements. Thus electrical crosstalk can be reduced or eliminated during operation. In another embodiment, the aluminum doped deep wall 180 may be extended to a conductive feature of MLI 130 operable to bias the deep wall to an electrical voltage for optimized isolation effect.

Figure 7:
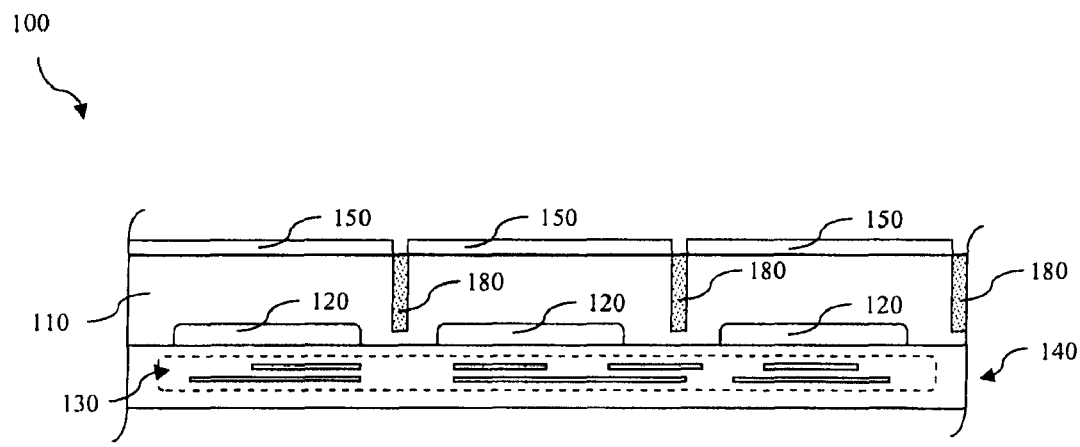

Referring to FIG. 7, the aluminum-containing layer 170 is removed after the aluminum doped deep wall 180 is formed by a proper process such as aluminum etching process known in the art. For example, an aluminum etchant may include phosphoric acid, acetic acid, nitric acid, hydrochloride, hydroperoxide, water, or proper combinations thereof. The etching solution may be heated to a temperature above the room temperature such as a temperature ranging between about 25° C. and 100° C. The masking layer 150 may be additionally removed to avoid scattering and/or absorption of imaging radiation by the masking layer during operations. In another embodiment, the aluminum-containing layer 170 and the masking layer 150 may be removed in a same step by a CMP process.

Figure 8:
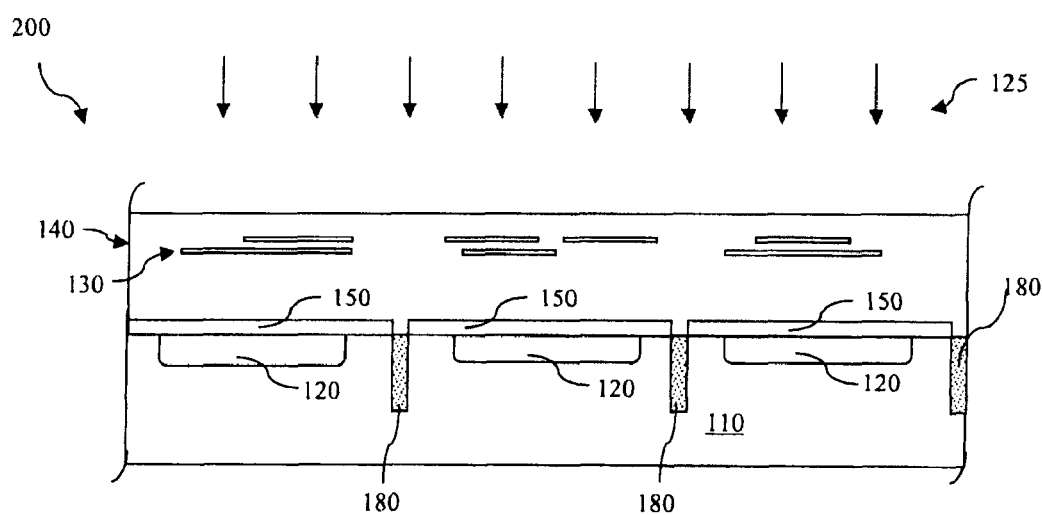
FIG. 8 illustrates a sectional view of another embodiment of a semiconductor device having a plurality of front-illuminated sensor elements and an aluminum doped feature constructed according to aspects of the present disclosure.

An aluminum-doped deep wall and deep junction formed thereby may also be incorporated into a front illuminated sensor device 200 as illustrated in FIG. 8 in a sectional view. The sensor device 200 includes a semiconductor substrate 110, a plurality of sensor elements 120, a MLI structure 130, and an ILD 140 substantially similar to those of the semiconductor device 100 in terms of composition, configuration, and formation. However, the semiconductor device 200 is designed for front illuminated application and operable to receive image radiation directed toward the front surface of the semiconductor substrate, as shown in FIG. 8. An aluminum doped deep wall 180 is formed in a semiconductor substrate 110 between adjacent sensor elements similar to that of the semiconductor device 100 of FIG. 7 but vertically extended substantially between the front surface of the semiconductor substrate 110 and the sensor elements 120. The method to form the aluminum doped deep wall 180 in the front illuminated sensor device 200 may be substantially similar to that for the semiconductor device 100 except for being formed in the front side of the semiconductor substrate. For example, a masking layer 150 is formed on the front surface of the semiconductor substrate and patterned to have a plurality of openings overlying regions of the substrate between adjacent sensor elements. An aluminum-containing layer is formed on the ILD 140 or a portion of the ILD 140 within the openings of and on the patterned masking layer 150. A thermal process is employed to drive aluminum into the semiconductor substrate to form an aluminum doped deep wall 180.

Variations may be implemented without departure of the spirit of the present disclosure. For example, for the semiconductor device 100 having a plurality of backside illuminated sensors, the aluminum-doped deep wall 180 may be alternatively formed before the formation of the MLI 130 and ILD 140. Thus, thermal issues such as thermal budget issue may be well eliminated since MLI structure was not present during the fabricating of the aluminum-doped deep wall 180. In another variation, the sensor element may not be imaging sensor and can be other proper sensor elements such as thermal sensors. The aluminum-doped wall 180 may include a plurality of portions, connected or not connected, disposed in a configuration to substantially eliminate crosstalk between two adjacent sensor elements. For example, the aluminum doped deep wall 180 may be designed to include a fence structure having a plurality of posts interposed between neighboring sensor elements and disposed around each sensor element. The thermal process to drive aluminum into the semiconductor substrate may include an additional field, such as an electrical field, to drive aluminum directionally toward the semiconductor substrate.

In the disclosed structure and the method to make the same, the illuminated light the device 100 or 200 designed to receive during applications may not be limited to visual light beam, it can be extended to other optical light such as infrared (IR) and ultraviolet (UV), and other proper radiation beam. Accordingly, the aluminum doped deep wall 180 may be properly designed and configured for effectively reflecting and/or absorbing the corresponding radiation beam.

The semiconductor device 100 and/or sensor device 200 may include a passivation layer disposed over the MLI and MLI. The device 100 may further include a transparent layer attached to the back surface of the semiconductor substrate 110 to mechanically support thereof and optically allow the backside-illuminated light passing through. The device 100 may include color filters interposed between the sensor elements 120 and the back surface of the semiconductor substrate 110 for color imaging applications. The device 100 may include a plurality of micro-lens interposed between the sensor elements 120 and the back surface of the semiconductor substrate 110, or between the color filters and the back surface if the color filters are implemented, such that the backside-illuminated light can be focused on the light-sensing regions. Since the aluminum doped deep wall is thin and deep in dimensions so that less area of the substrate 110 is occupied and efficient isolation function is provided.

Thus, the present disclosure provides an image sensor semiconductor device. The semiconductor device includes a sensor element formed in a semiconductor substrate; and a deep junction of aluminum dopants, formed in the semiconductor substrate, disposed horizontally around the sensor element in a top view of the semiconductor substrate.

In the semiconductor device, the semiconductor substrate may include crystalline silicon. The semiconductor substrate of the crystalline silicon may have a <100> or <111> orientation. The deep junction may include a depth greater than 1 micron. The deep junction of aluminum dopants may include a doping profile with a ratio of depth/width greater than about 3. The semiconductor device may further include a microlens disposed in the semiconductor substrate, designed to direct imaging radiation toward the sensor element. The deep junction of aluminum dopants may vertically extend between the sensor element and the microlens.

The present disclosure also provides an image sensor semiconductor device. The image sensor semiconductor device include a substrate having a front surface and a back surface; a plurality of sensor elements formed on the front surface of the substrate, each of the plurality of sensor elements configured to receive light directed towards the back surface; and an aluminum doped feature formed in the substrate and disposed horizontally between two adjacent elements of the plurality of sensor elements and vertically between the back surface and the plurality of sensor elements.

In the disclosed semiconductor device, the aluminum doped feature may include a depth/width ratio greater than about 3. The substrate may include a crystalline silicon configured in one of <100> and <111> orientation. The aluminum doped feature may include a height greater than about 1 micron. The aluminum doped feature may include an aluminum doping concentration ranging between about $10^{13}$ atoms/cm$^3$ and $10^{20}$ atoms/cm$^3$. Each of the plurality of sensor elements may be selected from the group consisting of complementary metal-oxide-semiconductor (CMOS) image sensor, charge-coupled device sensor, active pixel sensor, passive pixel sensor, and combinations thereof.

The present disclosure also provides an image sensor semiconductor device. The semiconductor device includes a sensor element formed in a semiconductor substrate; an inter-level dielectric (ILD) formed in the semiconductor substrate; conductive features disposed in the ILD; and an junction of aluminum dopants formed in the ILD and disposed horizontally around the sensor element in a top view of the semiconductor substrate.

In the disclosed semiconductor device, the junction may includes a depth greater than 1 micron. The deep junction of aluminum dopants may include a doping profile with a ratio of depth/width greater than about 3. The junction of aluminum dopants may include an aluminum doping concentration ranging between about $10^{13}$ atoms/cm$^3$ and $10^{20}$ atoms/cm$^3$.

The present disclosure also provides a method to fabricate a semiconductor device. The method includes: providing a semiconductor substrate with an orientation having a highest aluminum diffusion; forming a masking layer on the semiconductor substrate; forming an opening in the masking layer, exposing the semiconductor substrate within the opening; forming an aluminum-containing layer on the masking layer and on the semiconductor substrate within the opening; and driving aluminum from the aluminum-containing layer into the semiconductor substrate through the opening of the masking layer to form a deep junction of aluminum dopants horizontally around the sensor element in a top view toward the semiconductor substrate.

The method may further include removing the aluminum-containing layer after the driving of aluminum. In the method, the driving of aluminum may include an annealing process. The driving of aluminum may include an annealing temperature ranging between about 400° C. and 1200° C. The annealing process may be selected from the group consisting of a thermal annealing, a laser annealing, and a combination thereof. The forming of the masking layer may include forming a layer having a material selected from the group consisting of silicon oxide, silicon nitride, silicon oxynitride, titanium, titanium nitride, tantalum, tantalum nitride, and combinations thereof. The forming of the masking layer may include forming the masking layer using a method selected from the group consisting of thermal oxidation, thermal nitridation, chemical vapor deposition, physical vapor deposition, spin-on coating, and combinations thereof. The forming of the opening may include utilizing a method selected from the group consisting of plasma etching, wet etching, and combinations thereof. The forming of the aluminum-containing layer may include utilizing a method selected from the group consisting of chemical vapor deposition, physical vapor deposition, plating, and combinations thereof. The semiconductor substrate may include a silicon substrate having a <100> or <111> orientation. The forming of the opening may include utilizing an etching process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   providing a semiconductor substrate having a front surface and a back surface;
   forming a masking layer on the back surface of the semiconductor substrate;
   forming an opening in the masking layer, the opening configured to expose the semiconductor substrate within the opening;
   forming an aluminum-containing layer on the masking layer and on the semiconductor substrate within the opening; and
   driving aluminum from the aluminum-containing layer into the semiconductor substrate through the opening of the masking layer to form a junction of aluminum dopants around a sensor element that extends from the back surface without extending to the front surface.

2. The method of claim 1, further comprising removing the aluminum-containing layer after the driving of aluminum.

3. The method of claim 1, wherein the driving of aluminum comprises an annealing process.

4. The method of claim 3, wherein the driving of aluminum comprises an annealing temperature ranging between about 40° C. and about 1200° C.

5. The method of claim 3, wherein the annealing process is selected from the group consisting of a thermal annealing, a flash annealing, a laser annealing, and a combination thereof.

6. The method of claim 1, wherein the forming of the masking layer comprises forming the masking layer using a method selected from the group consisting of thermal oxidation, thermal nitridation, chemical vapor deposition, physical vapor deposition, spin-on coating, and combinations thereof.

7. The method of claim 1, wherein the forming of the aluminum-containing layer comprises utilizing a method selected from the group consisting of chemical vapor deposition, physical vapor deposition, plating, and combinations thereof.

8. The method of claim 1, wherein the forming of the opening comprises utilizing an etching process.

9. A method of fabricating a semiconductor device, comprising:
   providing a semiconductor substrate having a front surface and a back surface;
   forming a plurality of sensor elements on the front surface of the substrate, each of the plurality of sensor elements configured to receive light directed towards the back surface; and
   forming an aluminum doped feature in the substrate extending from the back surface but not extending to the front surface, the aluminum doped feature disposed horizontally between two adjacent elements of the plurality of sensor elements and vertically between the back surface and the plurality of sensor elements.

10. The method of claim 9, wherein forming the aluminum doped feature includes:
    forming a masking layer on the back surface of the semiconductor substrate;
    forming an opening in the masking layer, the opening configured to expose the semiconductor substrate within the opening; and forming an aluminum-containing layer on the masking layer and on the semiconductor substrate within the opening.

11. The method of claim 10, wherein forming the aluminum doped features includes annealing the aluminum-containing layer using an annealing process selected from the group consisting of a thermal annealing, a flash annealing, a laser annealing, and a combination thereof.

12. The method of claim 9, wherein forming the aluminum doped feature in the substrate includes forming the aluminum doped feature between the back surface and the plurality of sensor elements on the front surface.

13. The method of claim 10, further comprising removing the aluminum-containing layer and the masking layer after the forming of the aluminum doped feature.

14. A method of fabricating an image sensor semiconductor device, comprising:
   providing a semiconductor substrate having a front surface and a back surface;
   forming a sensor element in the semiconductor substrate;
   forming an inter-level dielectric (ILD) on the front surface of the semiconductor substrate; and
   forming a junction of aluminum dopants in the semiconductor substrate and extending from the back surface without extending to the front surface.

15. The method of claim 14, wherein forming the junction of aluminum dopants includes forming the junction of aluminum dopants horizontally around the sensor element in a top view of the semiconductor substrate.

16. The method of claim 14, wherein forming the junction of aluminum dopants includes:
   forming a masking layer on the back surface of the semiconductor substrate;
   forming an opening in the masking layer, the opening configured to expose the semiconductor substrate within the opening; and
   forming an aluminum-containing layer on the masking layer and on the semiconductor substrate within the opening;

17. The method of claim 14, wherein the semiconductor substrate comprises a crystalline silicon configured in one of <100> and <111> orientation.

18. The method of claim 14, wherein the sensor element is selected from the group consisting of complementary metal-oxide-semiconductor (CMOS) image sensor, charge-coupled device sensor, active pixel sensor, passive pixel sensor, and combinations thereof.

19. The method of claim 14, wherein forming the junction of aluminum dopants includes forming the junction of aluminum dopants extending from the back surface towards the front surface a distance that is greater than one-fourth of a thickness of the semiconductor substrate.

20. The method of claim 19, wherein the distance is greater than about 1 micron.

* * * * *